United States Patent
Horiguchi et al.

(10) Patent No.: US 8,658,914 B2
(45) Date of Patent: Feb. 25, 2014

(54) ELECTRONIC COMPONENT DEVICE AND METHOD FOR MANUFACTURING THE SAME

(75) Inventors: Hiroki Horiguchi, Nagaokakyo (JP); Yuji Kimura, Nagaokakyo (JP)

(73) Assignee: Murata Manufacturing Co., Ltd., Nagaokakyo-Shi, Kyoto-Fu (JP)

(*) Notice: Subject to any disclaimer, the term of this patent is extended or adjusted under 35 U.S.C. 154(b) by 203 days.

(21) Appl. No.: 13/023,055

(22) Filed: Feb. 8, 2011

(65) Prior Publication Data

US 2011/0132655 A1 Jun. 9, 2011

Related U.S. Application Data

(63) Continuation of application No. PCT/JP2009/064155, filed on Aug. 21, 2009.

(30) Foreign Application Priority Data

Aug. 21, 2008 (JP) .................................. 2008-212470
Feb. 9, 2009 (JP) .................................. 2009-027108

(51) Int. Cl.
  *H05K 7/02* (2006.01)
  *H01L 23/48* (2006.01)

(52) U.S. Cl.
  USPC ............ 174/541; 174/557; 257/766; 257/772

(58) Field of Classification Search
  USPC ........... 174/541, 564, 557; 257/684, 766, 772
  See application file for complete search history.

(56) References Cited

U.S. PATENT DOCUMENTS

| | | | |
|---|---|---|---|
| 7,138,293 B2 * | 11/2006 | Ouellet et al. | ............... 438/106 |
| 7,259,032 B2 | 8/2007 | Murata et al. | |
| 7,423,349 B2 | 9/2008 | Ishihara et al. | |

FOREIGN PATENT DOCUMENTS

| | | | |
|---|---|---|---|
| JP | 2004-111935 A | 4/2004 | |
| JP | 2004194290 A | 7/2004 | |
| JP | 2006-108162 A | 4/2006 | |
| JP | 2006-135264 A | 5/2006 | |
| JP | 2006-310507 A | 11/2006 | |

OTHER PUBLICATIONS

PCT/JP2009/064155 Written Opinion dated Apr. 9, 2009.

* cited by examiner

*Primary Examiner* — Hung Ngo
(74) *Attorney, Agent, or Firm* — Dickstein Shapiro LLP

(57) ABSTRACT

An electronic component device having a first sealing frame formed on a main substrate and a second sealing frame formed on a cover substrate, both of which are composed of a Ni film. A bonding section bonds the first sealing frame to the second sealing frame. For example, a Bi layer is formed on the first sealing frame and an Au layer is formed on the second sealing frame, and then the first sealing frame and the second sealing frame are heated at a temperature of 300° C. for 10 seconds while applying pressure in the direction in which the first sealing frame and the second sealing frame are close contact with each other to form the bonding section. The bonding section is constituted by a mixed layer predominantly composed of a mixed alloy of a Ni—Bi—Au ternary alloy and $Au_2Bi$.

9 Claims, 7 Drawing Sheets

ELECTRONIC COMPONENT DEVICE AND METHOD FOR MANUFACTURING THE SAME

CROSS REFERENCE TO RELATED APPLICATIONS

The present application is a continuation of International Application No. PCT/JP2009/064155, filed Aug. 21, 2009, which claims priority to Japanese Patent Application No. JP2008-212470, filed Aug. 21, 2008, and Japanese Patent Application No. JP2009-027108, filed Feb. 9, 2009, the entire contents of each of these applications being incorporated herein by reference in their entirety.

FIELD OF THE INVENTION

The present invention relates to an electronic component device and a method for manufacturing the same, and particularly to an electronic component device having a structure of bonding conductive films to be a sealing frame to each other, for example, for hermetic sealing, and a method for manufacturing the same.

BACKGROUND OF THE INVENTION

Electronic component devices of interest to the present invention include, for example, a BAW filter. The BAW filter includes a main substrate provided with an electronic circuit forming section and a first sealing frame surrounding the electronic circuit forming section on one main surface of the main substrate, and a cover substrate provided with a second sealing frame to be bonded to the first sealing frame on one main surface of the cover substrate. Then, the main substrate and the cover substrate are disposed so that the main surfaces of the two substrates face each other, and in this state, the first sealing frame and the second sealing frame are bonded to each other to realize a structure in which the above-mentioned electronic circuit forming section is hermetically sealed.

The following technologies has been proposed as a technology for bonding the first sealing frame and the second sealing frame to each other to seal an electronic component device as described above.

First, a sealing technology based on a Cu—Sn alloy has been proposed in Japanese Unexamined Patent Publication No. 2004-194290 (Patent Document 1) and Japanese Unexamined Patent Publication No. 2006-135264 (Patent Document 2). This sealing technology will be described with reference to FIG. 8.

In FIG. 8, a part of each of a main substrate 1 and a cover substrate 2, which are disposed so as to face each other, is shown. As shown in FIG. 8(1), a first sealing frame 3 is formed on an upper main surface of the main substrate 1, and on the other hand, a second sealing frame 4 is formed on a lower main surface of the cover substrate 2 before a bonding step is performed. The first and second sealing frames 3 and 4 are composed of, for example, copper (Cu). An oxidation resistant film 5 composed of Au, for example, is formed on the first sealing frame 3 as required as shown by the dotted line. The oxidation resistant film 5 is a film for preventing the oxidation of Cu constituting the first sealing frame 3, and does not contributes directly to bonding described later. On the other hand, a Sn layer 6 predominantly composed of Sn having a lower melting point than Cu is formed on the second sealing frame 4. The Sn layer 6 functions as a bonding material.

In order to attain a state in which the first sealing frame 3 is bonded to the second sealing frame 4, the first sealing frame 3 and the second sealing frame 4 are brought into a contact state, in which the two frames face each other with the Sn layer 6 interposed therebetween, by applying pressure, and the first sealing frame 3 and the second sealing frame 4 are heated while maintaining the contact state. Consequently, first, Au constituting the oxidation resistant film 5 is dissolved in the Sn layer 6, and then, Cu constituting the first and second sealing frames 3 and 4 diffuses into the Sn layer 6 to produce an intermetallic compound of Cu and Sn.

More specifically, when heating in pressurization as described above is continued, the Sn layer 6 disappears, and first, a $Cu_6Sn_5$ layer 7 predominantly composed of $Cu_6Sn_5$ having a melting point of 415° C. is formed as shown in FIG. 8(2), and a $Cu_3Sn$ layer 8 predominantly composed of $Cu_3Sn$ having a melting point of 640° C. begins to be formed between the $Cu_6Sn_5$ layer 7 and each of the first sealing frame 3 and the second sealing frame 4.

When the heating in pressurization is further continued, the $Cu_6Sn_5$ layer 7 disappears as shown in FIG. 8(3), and a bonding structure, in which a bonding section 9 bonding the first sealing frame 3 to the second sealing frame 4 is constituted by the $Cu_3Sn$ layer 8, is attained.

In the bonding structure as describe above, it is important that the $Cu_6Sn_5$ layer 7 disappears and the bonding section 9 is constituted by the $Cu_3Sn$ layer 8. The reason for this is that if the $Cu_6Sn_5$ layer 7 remains, the interdiffusion between Cu and Sn further proceeds so that the $Cu_6Sn_5$ layer 7 will change to the $Cu_3Sn$ layer 8 when the bonding section 9 is exposed to used reflow or high-temperature environment for a long time, and so-called Kirkendall voids may be generated due to difference in diffusion coefficients between Cu and Sn during the interdiffusion proceeds to cause defective sealing.

In order to attain a state in which the $Cu_6Sn_5$ layer 7 disappears and the bonding section 9 is constituted by the $Cu_3Sn$ layer 8, it is necessary to diffuse Cu adequately into Sn, but the alloy growth rate of $Cu_3Sn$ is extremely small as shown in FIG. 9. In addition, FIG. 9 shows the growth rates of alloys at 300° C. Therefore, in order to attain a state in which the bonding section 9 is constituted by the $Cu_3Sn$ layer 8, for example, the condition that a temperature of 300° C. is held for 60 minutes under a pressure of 8.2 Mpa is required. Therefore, this process leads to a problem that productivity is low and production cost is high. Further, the above-mentioned conditions may be extreme conditions of impairing the quality of the electronic circuit forming section included in the electronic component device.

Next, in Japanese Unexamined Patent Publication No. 2006-108162 (Patent Document 3), it has been proposed that a layer of a low melting point material composed of Bi is disposed between wet layers composed of Ni and is heated while applying pressure, and thus Bi constituting the layer of a low melting point material is melted to bond the wet layers to each other to seal an electronic component device.

There is no description concerning an alloy state formed at the bonding section after sealing in Patent Document 3, but it is estimated that Bi is more likely to remain in the bonding section. Since Bi is melted at 271° C., if for example, a solder reflow step is performed on an electronic component device including such a bonding section, Bi may be melted and therefore a hermetically sealing state may be impaired.

Next, in Japanese Unexamined Patent Publication No. 2004-111935 (Patent Document 4), it has been proposed that an intermediate alloy layer is formed by solid-liquid diffusion of Bi and Ni and bonding is performed with the intermediate alloy layer. Examples of alloys formed from Ni and Bi include NiBi. However, the alloy growth rate of NiBi is small as with Cu₃Sn described above. Therefore, this process leads to a problem that productivity is low and production cost is high.

Patent Document 1: Japanese Unexamined Patent Publication No. 2004-194290

Patent Document 2: Japanese Unexamined Patent Publication No. 2006-135264

Patent Document 3: Japanese Unexamined Patent Publication No. 2006-108162

Patent Document 4: Japanese Unexamined Patent Publication No. 2004-111935

SUMMARY OF THE INVENTION

Thus, it is an object of the present invention to provide an electronic component device capable of solving the above-mentioned problems and a method for manufacturing the same.

The present invention is first directed to a structure of an electronic component device including a first member provided with a first Ni film predominantly composed of Ni, a second member provided with a second Ni film predominantly composed of Ni, and a bonding section which bonds the first Ni film to the second Ni film, and in order to solve the above technical problems, the present invention has a feature that the bonding section is constituted by a ternary alloy layer predominantly composed of a Ni—Bi—Au ternary alloy, a mixed layer predominantly composed of a mixed alloy of a Ni—Bi—Au ternary alloy and $Au_2Bi$, or an $Au_2Bi$ layer predominantly composed of $Au_2Bi$.

In a preferred embodiment of the electronic component device of the present invention, the first member is a main substrate provided with an electronic circuit forming section and a first sealing frame surrounding the electronic circuit forming section on one main surface of the main substrate and the second member is a cover substrate provided with a second sealing frame to be bonded to the first sealing frame on one main surface of the cover substrate, and the first sealing frame is made of the first Ni film and the second sealing frame is made of the second Ni film.

In the above embodiment, it is preferred that a first connecting electrode is formed at a location, surrounded by the first sealing frame, on the one main surface of the main substrate and a second connecting electrode is formed at a location, surrounded by the second sealing frame, on the one main surface of the cover substrate, and an electrically connecting section electrically connecting the first connecting electrode to the second connecting electrode is disposed and the electrically connecting section has a constitution similar to that of the bonding section.

The present invention is also directed to the method for manufacturing an electronic component device as described above.

The method for manufacturing an electronic component device of the present invention has a feature that the method includes the steps of preparing a first member provided with a first Ni film predominantly composed of Ni; preparing a second member provided with a second Ni film predominantly composed of Ni; and heating and bonding for forming a bonding section which bonds the first Ni film to the second Ni film by being the first Ni film and the second Ni film in close contact with each other and heating the first Ni film and the second Ni film with a Bi layer predominantly composed of Bi and an Au layer predominantly composed of Au interposed between the first Ni film and the second Ni film.

In a preferred embodiment of the method for manufacturing an electronic component device of the present invention, in the heating and bonding step, heating at a temperature of a melting point of an Au—Bi eutectic composition or higher and at a melting point of Bi or lower is carried out.

Further, in a preferred embodiment of the method for manufacturing an electronic component device of the present invention, pressure is applied in the direction in which the first Ni film and the second Ni film are in close contact with each other in the heating and bonding step.

There are cases where the bonding section formed in the heating and bonding step is constituted by a mixed layer predominantly composed of a mixed alloy of a Ni—Bi—Au ternary alloy and $Au_2Bi$, a ternary alloy layer predominantly composed of a Ni—Bi—Au ternary alloy and a $Au_2Bi$ layer predominantly composed of $Au_2Bi$.

In a preferred embodiment of the method for manufacturing an electronic component device of the present invention, the first member is a main substrate provided with an electronic circuit forming section and a first sealing frame surrounding the electronic circuit forming section on one main surface of the main substrate and the second member is a cover substrate provided with a second sealing frame to be bonded to the first sealing frame on one main surface of the cover substrate, and the first sealing frame is made of the first Ni film and the second sealing frame is made of the second Ni film. The method for manufacturing an electronic component device of the present invention is applied for bonding the first sealing frame and the second sealing frame to each other.

In the above preferred embodiment, it is preferred that when a first connecting electrode is formed at a location, surrounded by the first sealing frame, on the one main surface of the main substrate and a second connecting electrode is formed at a location, surrounded by the second sealing frame, on the one main surface of the cover substrate, the step of electrically connecting the first connecting electrode to the second connecting electrode is performed concurrently with performing the heating and bonding step.

Further, in the above preferred embodiment, it is preferred that a dimension in the width direction of at least one of the first Ni film and the second Ni film is larger than a dimension in the width direction of the Bi layer.

In the method for manufacturing an electronic component device of the present invention, it is preferred that the Bi layer is formed on any one film of the first Ni film and the second Ni film, and the Au layer is formed on any other film of the first Ni film and the second Ni film prior to the heating and bonding step.

In the method for manufacturing an electronic component device of the present invention, it is also preferred that a first Au layer is formed on any one film of the first Ni film and the second Ni film, the Bi layer is formed on the first Au layer, and a second Au layer is formed on any other film of the first Ni film and the second Ni film prior to the heating and bonding step.

In accordance with the present invention, since the Ni—Bi—Au ternary alloy, or the mixed alloy of a Ni—Bi—Au ternary alloy and $Au_2Bi$, or $Au_2Bi$, which is formed at the bonding section, has a rapid growth rate as compared with Cu₃Sn or NiBi described above, the bonding section can be formed in a short time and production cost can be reduced.

Further, in accordance with the present invention, it is possible to prevent the alloy formed at the bonding section from melting, for example, in a solder reflow step since the alloy has a high melting point of 280° C. or more. Accordingly, when the electronic component device of the present invention includes the main substrate and the cover substrate, the electronic circuit forming section and the first sealing frame surrounding the electronic circuit forming section are formed on one main surface of the main substrate, the second sealing frame to be bonded to the first sealing frame is formed on one main surface of the cover substrate and the present invention is applied for bonding the first sealing frame to the second sealing frame, the hermeticity of the electronic component device is not impaired even after the solder reflow step.

As described above, in the case where the electronic component device of the present invention includes the main substrate and the cover substrate, when the first connecting electrode is formed at a location, surrounded by the first sealing frame, on one main surface of the main substrate and a second connecting electrode is formed at a location, surrounded by the second sealing frame, on one main surface of the cover substrate, if the first connecting electrode is electrically connected to the second connecting electrode concurrently with performing a heating and bonding step on the first sealing frame and the second sealing frame, sealing and electrical connection can be achieved at one time, and therefore the number of steps for manufacturing the electronic component device can be decreased and the production cost can be reduced.

In the present invention, when the bonding section is constituted by a mixed layer of two types of alloys, a ternary alloy and $Au_2Bi$, a strain is generated due to difference in physical properties (a coefficient of linear expansion, etc.) between the two type of alloys, and this can cause environment resistance to deteriorate, but when the bonding section is constituted by a single alloy layer, for example, a ternary alloy layer or a $Au_2Bi$ layer, environment resistance can be improved.

In the heating and bonding step carried out in the method for manufacturing an electronic component device of the present invention, when heating at a temperature of a melting point of an Au—Bi eutectic composition or higher and at a melting point of Bi or lower is carried out, a hermetically sealing state can be secured without impairing the quality of the electronic circuit forming section even in an electronic component device including an electronic circuit forming section having low heat resistance.

In the heating and bonding step carried out in the method for manufacturing an electronic component device of the present invention, if pressure is applied in the direction in which the first Ni film and the second Ni film are in close contact with each other, since bonding progresses while eliminating Kirkendall voids generated due to difference in diffusion coefficients of the respective metals during the interdiffusion between the respective metals proceeds, defective sealing resulting from the Kirkendall voids remaining in the bonding section can be inhibited.

In the method for manufacturing an electronic component device of the present invention, when a dimension in the width direction of at least one of the first Ni film and the second Ni film is larger than a dimension in the width direction of the Bi layer, the protrusion of Bi from the bonding section can be inhibited in the heating and bonding step, and consequently undesired electric short circuit due to the protrusion of Bi can be hardly generated.

In the method for manufacturing an electronic component device of the present invention, when the Bi layer is formed on any one film of the first Ni film and the second Ni film and the Au layer is formed on any other film of the first Ni film and the second Ni film prior to the heating and bonding step, it is possible to attain a state in which the Bi layer and the Au layer are interposed between the first Ni film and the second Ni film by just arranging the first member and the second member in a predetermined manner in the heating and bonding step, and therefore the production steps of the electronic component device can be efficiently performed.

Further, in the method for manufacturing an electronic component device of the present invention, when the first Au layer is formed on any one film of the first Ni film and the second Ni film and the Bi layer is formed on the first Au layer, and the second Au layer is formed on any other film of the first Ni film and the second Ni film prior to the heating and bonding step, bonding can be performed securely even when for example, a forming method of the Ni layer is different from that of the Bi layer and therefore the time may elapse before the formation of the Bi layer since the formation of the Ni layer to form an oxide film on the surface of the Ni layer to interfere with a reaction between Ni and Bi.

DETAILED DESCRIPTION OF THE INVENTION

Figure 1:
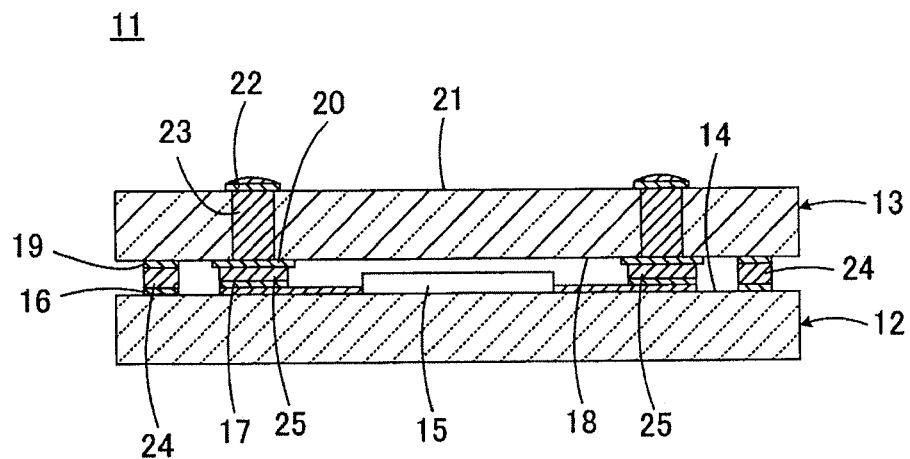
FIG. 1 is a sectional view showing a BAW filter 11 as an example of an electronic component device to which the present invention can be applied.

FIG. 1 is a sectional view showing a BAW filter 11 as an example of an electronic component device to which the present invention can be applied.

The BAW filter 11 includes a main substrate 12 composed of, for example, silicon (Si) and a cover substrate 13 composed of, for example, borosilicate glass. The main substrate 12 and the cover substrate 13 are disposed at a predetermined distance and face each other.

An electronic circuit forming section 15 (shown in a simplified manner) to form the BAW filter circuit and a first sealing frame 16 surrounding the electronic circuit forming section 15 are formed on an upper main surface 14 of the main substrate 12. Further, several first connecting electrodes 17 leading out of the electronic circuit forming section 15 are formed at a location, surrounded by the first sealing frame 16, on the upper main surface 14 of the main substrate 12.

On the other hand, a second sealing frame 19 to be bonded to the first sealing frame 16 is formed on a lower main surface 18 of the cover substrate 13. Further, several second connecting electrodes 20 corresponding to the first connecting electrodes 17 are formed at a location, surrounded by the second sealing frame 19, on the lower main surface 18 of the cover substrate 13. Several terminal electrodes 22 are formed on an upper main surface 21 of the cover substrate 13 and each of these terminal electrodes 22 is electrically connected to a second connecting electrode 40 through a through hole conductor 23 penetrating through the cover substrate 13 in a thickness direction.

In manufacturing such a BAW filter 11, the first sealing frame 16 and the second sealing frame 19 are bonded to each other. A bonding section 24 formed by this bonding is shown in FIG. 1. The first and second sealing frames 16 and 19 extend in the form of substantial rectangle, and the electronic circuit forming section 15 is hermetically sealed when these frames are bonded to each other. Preferably, the step of electrically connecting the first connecting electrode 17 to the second connecting electrode 20 is performed concurrently with performing the step of bonding the first sealing frame 16 to the second sealing frame 19. An electrically connecting section 25 obtained by this electric connection is shown in FIG. 1, and the electrically connecting section 25 preferably has a constitution similar to that of the above-mentioned bonding section 24.

Hereinafter, several embodiments of the present invention will be described concerning the. BAW filter 11 shown in FIG. 1.

Figure 2:
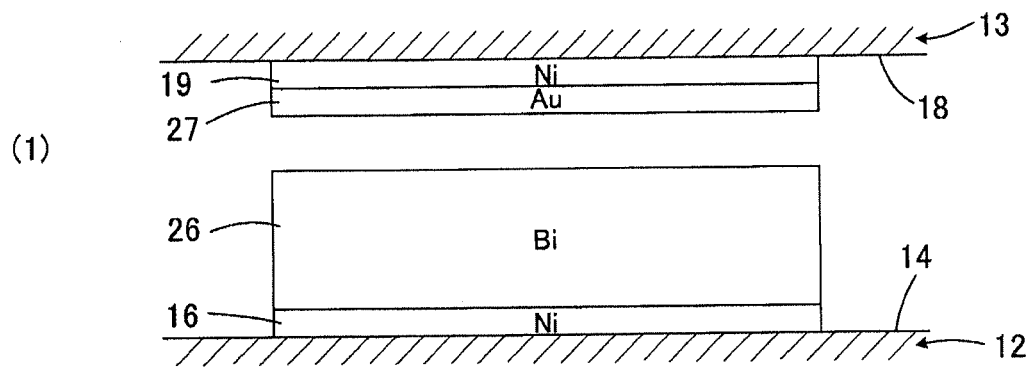
FIG. 2 is a view for illustrating the first embodiment of the present invention and an enlarged sectional view of a first sealing frame 16 and a second sealing frame 19 shown in FIG. 1, and FIG. 2(1) shows a pre-bonding state and FIG. 2(2) shows a post-bonding state of the first sealing frame 16 and the second sealing frame 19.
Figure 2:
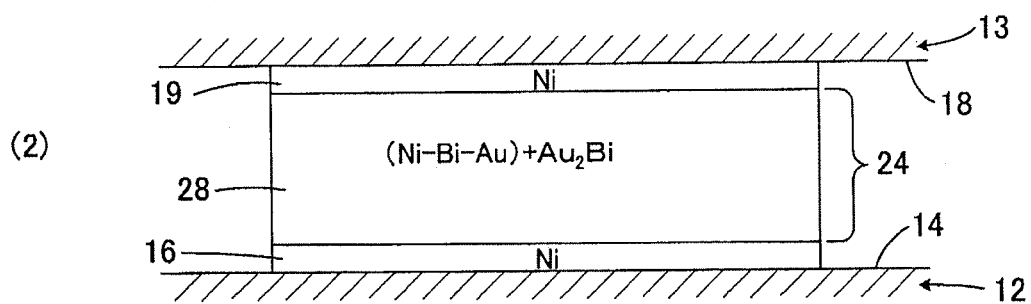

FIG. 2 is a view for illustrating the first embodiment of the present invention and shows an enlarged view of a part of the first sealing frame 16 and a part of the second sealing frame 19 in FIG. 1. FIG. 2(1) shows a pre-bonding state and FIG. 2(2) shows a post-bonding state of the first sealing frame 16 and the second sealing frame 19.

With reference to FIG. 2(1), both of the first sealing frame 16 and the second sealing frame 19 are composed of a Ni film predominantly composed of Ni. Each of the widths of the first and second sealing frames 16 and 19 is, for example, 50 μm. In addition, in order to enhance adhesion between the Ni film and each of the main substrate 12 and the cover substrate 13, a Ti film, but not shown, may be formed between the Ni film and the main substrate 12 and between the Ni film and the cover substrate 13.

A Bi layer 26 predominantly composed of Bi is formed on the first sealing frame 16. On the other hand, an Au layer 27 predominantly composed of Au is formed on the second sealing frame 19. The Ni film, the Bi layer 26 and the Au layer 27, which become layers on the first sealing frame 16 and the second sealing frame 19, are formed, for example, by vapor deposition, plating or the like.

In order to attain the structure shown in FIG. 2(2) described later, the thickness of the Ni film constituting each of the first and second sealing frames 16 and 19 is determined in such a way that a total volume of Ni supplied from the first and second sealing frames 16 and 19 is 16.5% or more of a volume of the Bi layer 26 supplied. As an example, when the thickness of the Bi layer is 5 μm, the Ni film constituting each of the first and second sealing frames 16 and 19 is set so as to be 0.83 μm or more in the total thickness.

Further, in order to attain the structure shown in FIG. 2(2) described later, the thickness of the Au layer 27 is determined in such a way that a volume of Au supplied from the Au layer 27 is 11.1% or more and 27% or less of volume of the Bi layer 26 supplied. As an example, when the thickness of the Bi layer 26 is 5 μm, the thickness of the Au layer 27 is set so as to be 0.55 μm or more and 1.35 or less.

Further, in the embodiment shown in FIG. 2(1), the Bi layer 26 is formed on the first sealing frame 16, and the Au layer 27 is formed on the second sealing frame 19, but the positions of the Bi layer 26 and the Au layer 27 may be reversed. Further, the Au layer 27 may be formed on the Bi layer 26, or may be formed on both of the Bi layer 26 and the second sealing frame 19. Furthermore, the Au layer 27 may be formed beneath the Bi layer 26, or may be formed both beneath the Bi layer 26 and on the second sealing frame 19.

Next, the heating and bonding step for forming a bonding section 24, which bonds the first sealing frame 16 to the second sealing frame 19, is performed by heating while applying pressure in the direction in which the first sealing frame 16 and the second sealing frame 19 are in close contact with each other with the Bi layer 26 and the Au layer 27 interposed between the first sealing frame 16 and the second sealing frame 19. A state after performing the heating and bonding step is shown in FIG. 2(2).

The above-mentioned heating and bonding step is performed in a nitrogen atmosphere in which an oxygen concentration is, for example, 100 ppm or less. In addition, the atmosphere in the heating and bonding step may be an atmosphere of inert gas other than nitrogen, or may be a reducing atmosphere or vacuum. An application of pressure in the heating and bonding step has an effect of accelerating wetting of the Au layer 27 and the first and second sealing frames 16 and 19 respectively composed of the Ni film by Bi contained in the Bi layer 26, and an effect of suppressing the formation of voids at the time of forming alloys, and for example, a surface pressure of 8 Mpa is applied. However, when the oxide film formed on the surface of the Ni film is removed by a physical treatment such as plasma etching or a chemical treatment and then bonding is performed without being exposed to an oxidizing atmosphere, bonding can be performed without applying pressure. Further, when the heat resistance of the electronic circuit forming section included in the electronic component device is adequately high, a peak temperature in the heating and bonding step is 271° C. at which Bi is melted or more.

For example, when the thickness of the Bi layer 26 is 5 μm, the whole Bi layer 26 can be converted to a bonding section 24 constituted by a mixed layer 28 predominantly composed of a mixed alloy of a Ni—Bi—Au ternary alloy and $Au_2Bi$ as shown in FIG. 2(2) by just retaining the Bi layer at a peak temperature of 300° C. for mere 10 seconds. The bonding section 24 has a melting point of 280° C. or more and can be prevented from melting at at least 280° C.

On the other hand, in the case where heat resistance of the electronic circuit forming section included in the electronic component device is concerned, a peak temperature in the heating and bonding step may be 241° C. at which an Au—Bi eutectic composition is melted or more, and 271° C. at which Bi is melted or less. Pressure is applied in the direction in which the first sealing frame 16 and the second sealing frame 19 are in close contact with each other, and the bonding section 24 is heated while maintaining the intimate contact state between the Bi layer 26 and the Au layer 27 with the Bi layer 26 and the Au layer 27 interposed between the first sealing frame 16 and the second sealing frame 19, and thus the interdiffusion of Bi contained in the Bi layer 26 and Au contained in the Au layer 27 takes places at a contact interface between the Bi layer 26 and the Au layer 27 to form an alloy layer of Au—Bi eutectic composition. That is, even though the peak temperature in the heating and bonding step is 271° C. at which Bi is melted or less, if the peak temperature is 241° C. at which the Au—Bi eutectic composition is melted or more, the alloy layer of Au—Bi eutectic composition formed at a contact interface is melted, and therefore the bonding section 24, which bonds the first and the second sealing frames 16 and 19 to each other, can be formed. As a result, even when the heat resistance of the electronic circuit forming section included in the electronic component device is concerned, a hermetically sealing state can be secured without impairing the quality of the electronic circuit forming section.

In addition, the mixed layer 28 is formed through a process in which Au is dissolved in melted Bi and $Au_2Bi$ is precipitated in a ternary alloy in a cooling process. The location and form of precipitation of $Au_2Bi$ is not unique and there are various types of $Au_2Bi$ precipitation such as the case where $Au_2Bi$ is precipitated in the form of discontinuous dotted line at a position adjacent to the Ni film, or the case where $Au_2Bi$ is precipitated in the form of scattered isles in the ternary alloy. That is, since a boundary between the ternary alloy and $Au_2Bi$ does not necessarily appear clearly, the boundary is not shown in FIG. 2(2), and the mixed layer 28 is represented by "(Ni—Bi—Au)+$Au_2Bi$".

An average composition ratio of the Ni—Bi—Au ternary alloy described above is Ni:Bi:Au=11:73:16 (% by weight) (The composition ratio has a margin of error of about plus or minus 3% by weight. The supplied volume in the embodiment of the present invention is calculated based on the average composition ratio, but the supplied volume of each layer is really determined including a margin of error). In addition, the above-mentioned peak temperature and peak temperature retention time vary in optimum values, respectively, depending on the thickness of the Bi layer 26, a temperature raising rate and a cooling rate.

Figure 9:
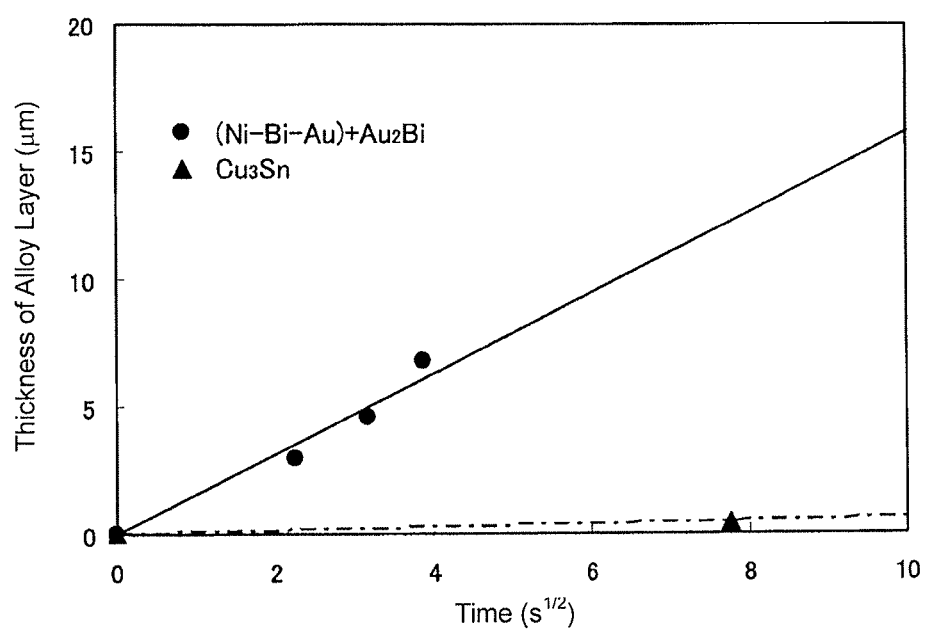
FIG. 9 is a view showing the growth rates of alloys at 300° C., and showing a growth rate of a mixed alloy of a Ni—Bi—Au ternary alloy and $Au_2Bi$, and a growth rate of $Cu_3Sn$.

The alloy growth rates of the Ni—Bi—Au ternary alloy and $Au_2Bi$ at 300° C. are shown by "(Ni—Bi—Au)+$Au_2Bi$" in FIG. 9. As is evident from FIG. 9, since the Ni—Bi—Au ternary alloy and $Au_2Bi$ have a rapid growth rate as compared with $Cu_3Sn$, for example, the alloy can be formed in a short time and therefore production cost can be reduced.

Further, since the Ni—Bi—Au ternary alloy and $Au_2Bi$ do not melt in the solder reflow step, the hermeticity of the BAW filter 11 can be secured even when the solder reflow step is applied.

Figure 3:
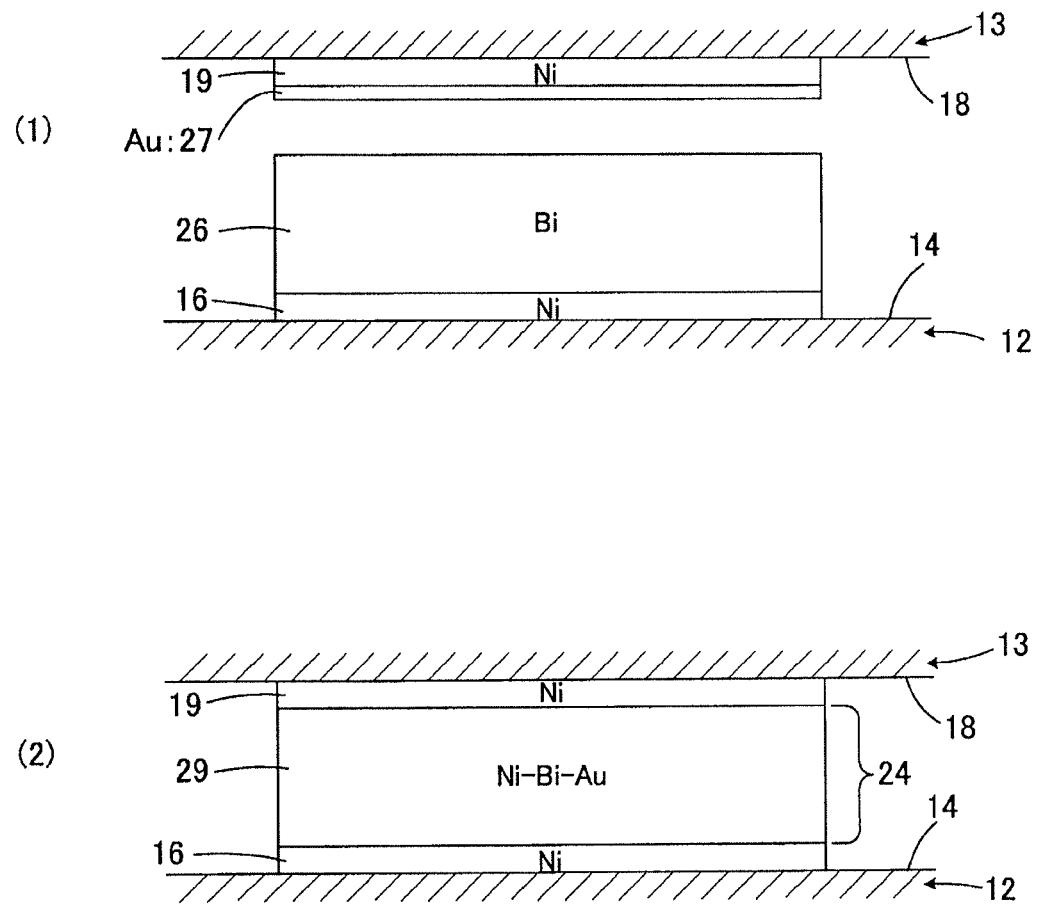
FIG. 3 is a view corresponding to FIG. 2 for illustrating the second embodiment of the present invention.

FIG. 3 is a view corresponding to FIG. 2 for illustrating the second embodiment of the present invention. In FIG. 3, the same reference symbols are given to elements corresponding to the elements shown in FIG. 2, and overlapped descriptions are omitted.

The second embodiment has a feature that the Au layer 27, which is smaller in thickness than that in the first embodiment, is formed to avoid the formation of an $Au_2Bi$ layer at the bonding section 24. That is, the thickness of the Au layer 27 is determined in such a way that a volume of Au supplied from the Au layer 27 is 11.1% of a volume of Bi supplied from the Bi layer 26. As an example, when the thickness of the Bi layer 26 is 5 μm, the thickness of the Au layer 27 is 0.55 μ. Consequently, as shown in FIG. 3(2), only a ternary alloy layer 29 predominantly composed of a Ni—Bi—Au ternary alloy is formed at the bonding section 24 as a result of the heating and bonding step.

Figure 4:
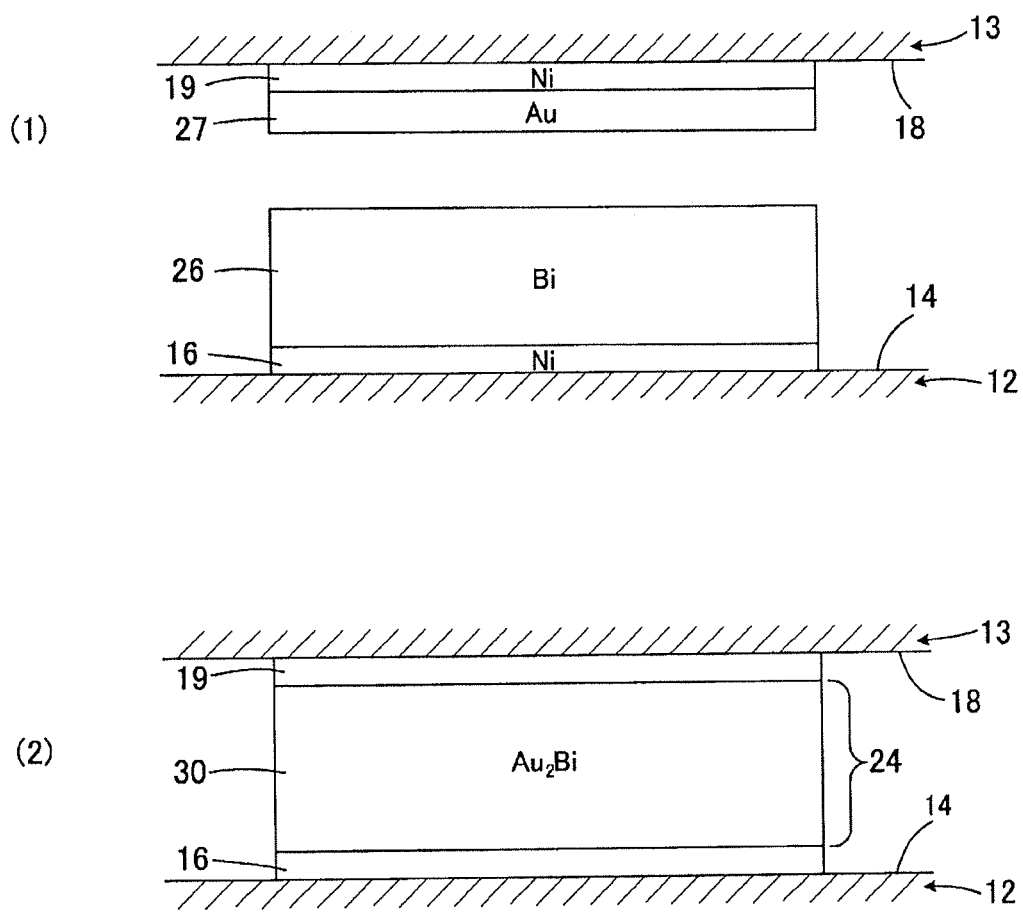
FIG. 4 is a view corresponding to FIG. 2 for illustrating the third embodiment of the present invention.

FIG. 4 is a view corresponding to FIG. 2 for illustrating the third embodiment of the present invention. In FIG. 4, the same reference symbols are given to elements corresponding to the elements shown in FIG. 2, and overlapped descriptions are omitted.

The third embodiment has a feature that the Au layer 27, which is larger in thickness than that in the first embodiment, is formed to avoid the formation of a ternary alloy layer predominantly composed of a Ni—Bi—Au ternary alloy at the bonding section 24. That is, the thickness of the Au layer 27 is determined in such a way that a volume of Au supplied from the Au layer 27 is 27% or more of a volume of Bi supplied from the Bi layer 26. As an example, when the thickness of the Bi layer 26 is 5 μm, the thickness of the Au layer 27 is 1.35 μm or more. By setting the thickness of the Au layer 27 like this, as shown in FIG. 4(2), only an $Au_2Bi$ layer 30 is formed at the bonding section 24 in performing the heating and bonding step.

In addition, when as distinct from the case of the Au layer 27 being formed on only the second sealing frame 19 as shown in FIG. 4, the Au layer 27 is formed on both of the Bi layer 26 on a side of the first sealing frame 16 and the second sealing frame 19, a total thickness of both Au layers 27 is set so as to be 1.35 μm or more.

In accordance with the second and third embodiments, since the bonding section 24 is constituted by a single alloy layer, for example, any one of the ternary alloy layer 29 and the $Au_2Bi$ layer 30, environment resistance can be more improved than the first embodiment.

Figure 5:
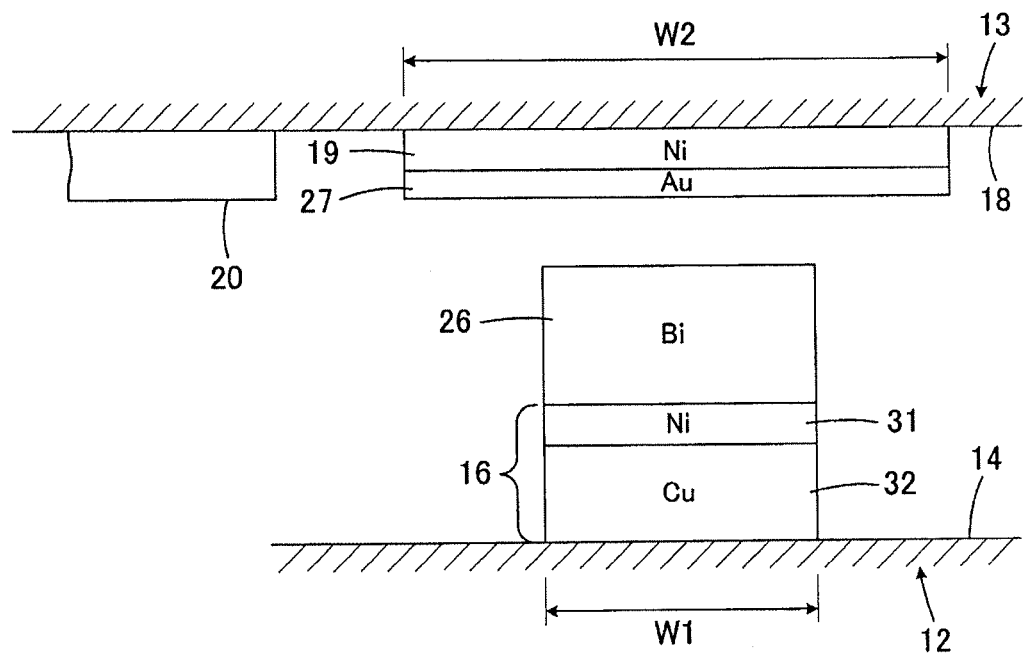
FIG. 5 is a view corresponding to FIG. 2(1) for illustrating the fourth embodiment of the present invention.

FIG. 5 is a view corresponding to FIG. 2(1) for illustrating the fourth embodiment of the present invention. In FIG. 5, the same reference symbols are given to elements corresponding to the elements shown in FIG. 2(1), and overlapped descriptions are omitted.

The fourth embodiment has a feature that a dimension W2 in the width direction of the second sealing frame 19 is larger than a dimension W1 in the width direction of the first sealing frame 16. This is a configuration for preventing Bi constituting the Bi layer 26 from protruding from the first sealing frame 16 due to the pressurization in the heating and bonding step to cause electric short circuit between the protruded Bi and the connecting electrode 20, for example. As an example, when the dimension W2 in the width direction of the second sealing frame 19 is 50 μm, the dimension W1 in the width direction of the first sealing frame 16 is set at about 15 to 25 μm.

In addition, in the embodiment shown in FIG. 5, at the first sealing frame 16, a Cu film 32 predominantly composed of Cu is formed in a thickness of 7.5 μm or more, for example, including the thickness of Ni film by a thick film formation technology before a Ni film 31 is formed. By forming a relatively thick Cu film 32 as described above, an effect of preventing the protrusion of Bi is enhanced. Further, by forming the thick Cu film 32, it can be expected to lessen thermal stress generated due to difference in coefficients of thermal expansion between the first member and the second member. However, if such an advantage is not particularly desired, the Ni film 31 may be formed directly on the main substrate 12 omitting the Cu film 32.

The fourth embodiment shown in FIG. 5 can be applied not only to the first embodiment shown in FIG. 2, but also to the second and third embodiments respectively shown in FIG. 3 and FIG. 4 or the fifth embodiment shown in FIG. 6 and FIG. 7 described later.

Further, in FIG. 5, the dimension W2 in the width direction of the second sealing frame 19 is larger than the dimension W1 in the width direction of the first sealing frame 16, but conversely, the dimension W1 in the width direction of the first sealing frame 16 may be larger than the dimension W2 in the width direction of the second sealing frame 19. However, a dimension in the width direction of the Bi layer 26 is matched with smaller one of the dimensions W1 and W2 in the width direction. The Bi layer 26 may be formed on any of the first sealing frame 16 and the second sealing frame 19.

Further, when Bi protrudes as described above, Bi tends to cohere in corner sections of the sealing frames 16 and 19, and therefore the corner sections are preferably formed into a circular arc in order to suppress such cohesion.

The above-mentioned constitution in the bonding section 24 which bonds the first sealing frame 16 to the second sealing frame 19 can be applied similarly to the electrically connecting section 25 which electrically connects the first connecting electrode 17 to the second connecting electrode 20. In this case, if the connecting step of electrically connecting the first connecting electrode 17 to the second connecting electrode 20 is performed concurrently with performing the heating and bonding step on the first sealing frame 16 and the second sealing frame 19, sealing and electrical connection can be achieved at one time, and therefore, the number of steps for manufacturing the BAW filter 11 can be decreased and the production cost can be reduced.

Further, the constitution for suppressing the protrusion of Bi, described with reference to FIG. 5, can also be applied to the connecting electrodes 17 and 20 as described above.

Further, the present invention can be applied not only to the BAW filter 11 including the main substrate 12 provided with the first sealing frame 16 and the cover substrate 13 provided with the second sealing frame 19, but also to other electronic component devices including similar main substrates and cover substrates, and furthermore the present invention can be applied to an electronic component device including a first member provided with not the sealing frame but just a first Ni film, and a second member provided with a second Ni film to be bonded to the first Ni film.

In the method for manufacturing an electronic component device of the present invention, a first collective substrate which gives a plurality of first members, and a second collective substrate which gives a plurality of second members are prepared, and the heating and bonding step may be performed in a state of the first collective substrate and the second collective substrate. In this case, after the heating and bonding step, a step, in which the first collective substrate and the second collective substrate are divided into each electronic component device unit, is further performed. In the heating and bonding step, it is preferable to use a chamber in which an inert gas can be introduced or a vacuum atmosphere can be produced while housing the first and second collective substrates. In accordance with such a manufacturing method, since a plurality of electronic component devices can be manufactured by one operation, the productivity improvements of the electronic component device can be expected.

Figure 6:
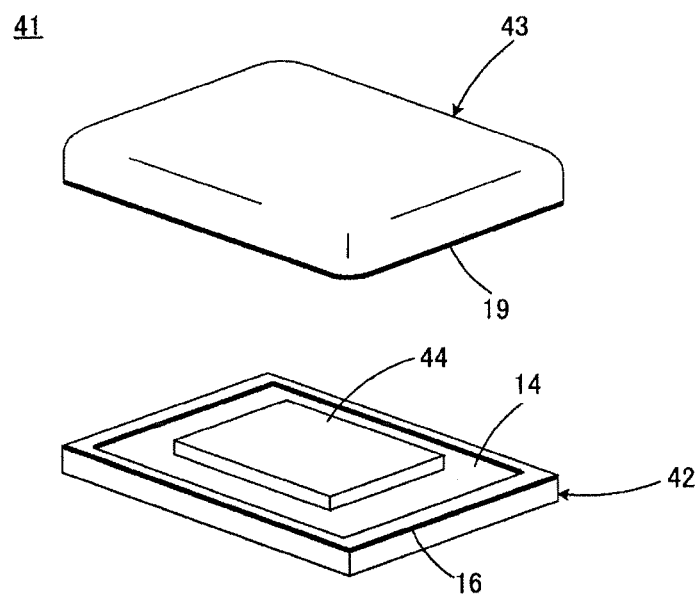
FIG. 6 is a view for illustrating the fifth embodiment of the present invention and a perspective view showing a main substrate 42 and a cover substrate 43 included in an electronic component device 41 separately.

Further, a cap-shaped substrate shown in FIG. 6 may be used for the cover substrate. FIG. 6 is a view for illustrating the fifth embodiment of the present invention and a perspective view showing a main substrate 42 and a cover substrate 43 included in an electronic component device 41 separately. FIG. 7 is an enlarged sectional view of a bonding section of the main substrate 42 and the cover substrate 43 shown in FIG. 6. In FIG. 6, the same reference symbols are given to elements corresponding to the elements shown in FIG. 2(1), and overlapped descriptions are omitted.

On an upper main surface 14 of the main substrate 42, an element 44 to form a required circuit is mounted and the first sealing frame 16 surrounding the element 44 is formed. In addition, a connecting conductor to be lead out of the element 44 is omitted in FIG. 6.

On the other hand, a recessed section 46 (refer to FIG. 7) is formed on a lower main surface of the cap-shaped cover substrate 43, and the second sealing frame 19 to be bonded to the first sealing frame 16 is formed on a lower side of a peripheral section 47 which defines the recessed section 46.

Figure 7:
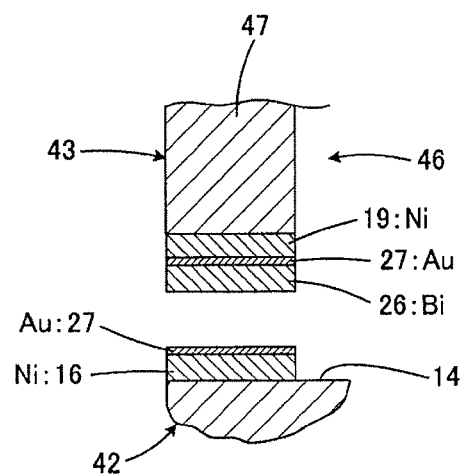
FIG. 7 is an enlarged sectional view of a bonding section of the main substrate 42 and the cover substrate 43 shown in FIG. 6.
Figure 8:
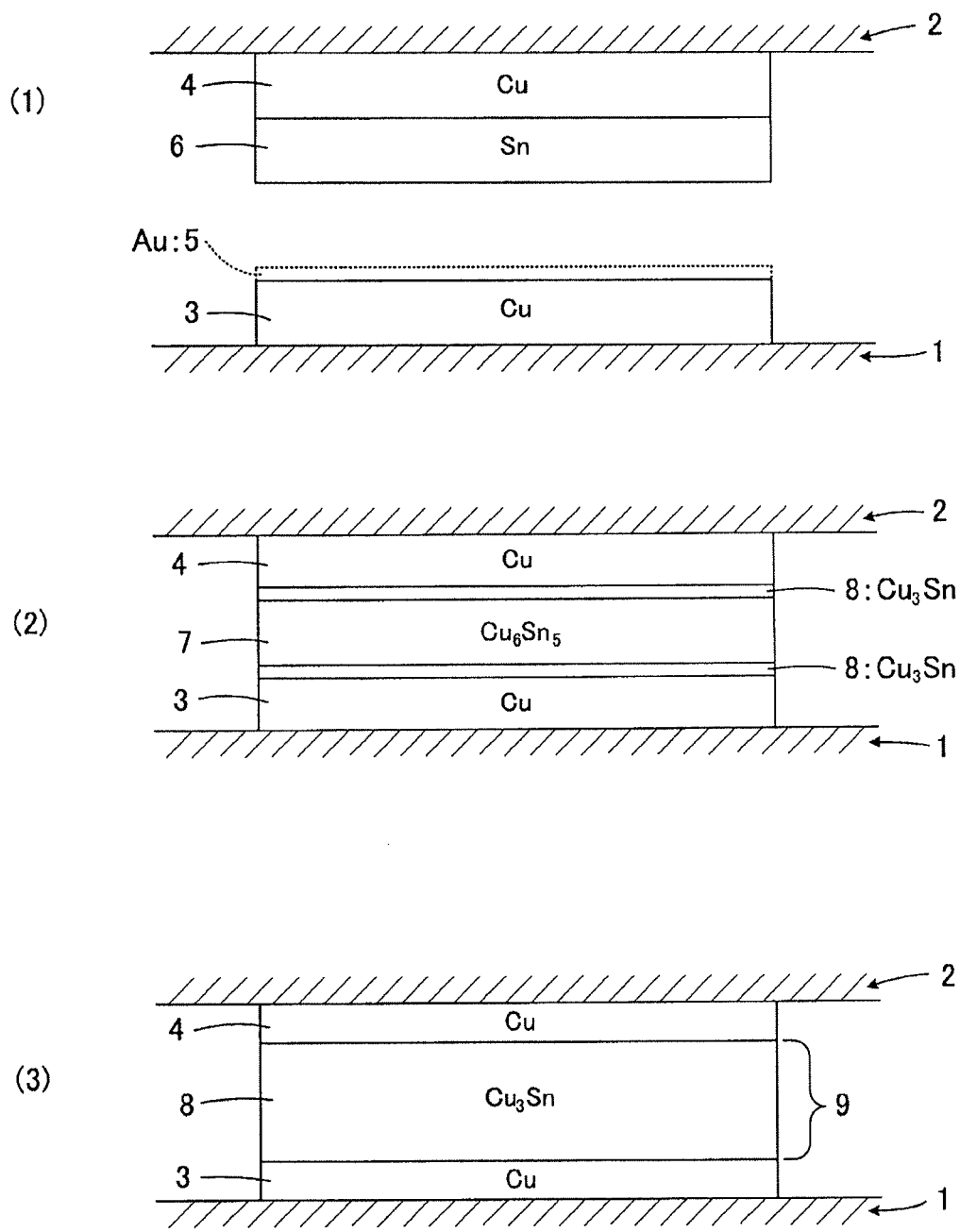
FIG. 8 is a sectional view showing a bonding step for illustrating a conventional art of interest to the present invention.

With reference to FIG. 7, both of the first sealing frame 16 and the second sealing frame 19 are constituted by a Ni film predominantly composed of Ni.

The Au layer 27 predominantly composed of Au is formed on the first sealing frame 16. On the other hand, the Au layer 27 predominantly composed of Au is formed on the second sealing frame 19 and the Bi layer 26 predominantly composed of Bi is formed thereon.

In addition, an arrangement of the oxidation resistant film 27 on the first sealing frame 16 and the Bi layer 26 on the second sealing frame 19 and the like may be modified as other embodiments. For example, the Bi layer 26 may be formed on the main substrate 42 side.

Further, also in this embodiment, the main substrate 42 is prepared in a state of a collective substrate constituting a plurality of main substrates 42, and the main substrate 42 may be bonded to the cover substrates 43 in the state of a collective substrate, and then divided into each main substrate 42, or may be bonded to the cover substrate 43 in a state of each main substrate 42.

DESCRIPTION OF REFERENCE SYMBOLS

11 BAW filter (electronic component device)
12, 42 main substrate
13, 43 cover substrate
15 electronic circuit forming section
16 first sealing frame
17 first connecting electrode
19 second sealing frame
20 second connecting electrode
24 bonding section
25 electrically connecting section
26 Bi layer
27 Au layer
28 mixed layer
29 ternary alloy layer
30 $Au_2Bi$ layer
41 electronic component device

The invention claimed is:

1. An electronic component device comprising:
a first member provided with a first Ni film predominantly composed of Ni;
a second member provided with a second Ni film predominantly composed of Ni; and
a bonding section which bonds said first Ni film to said second Ni film, wherein
said bonding section is constituted by a ternary alloy layer predominantly composed of one of a Ni—Bi—Au ternary alloy; and a mixed layer predominantly composed of a mixed alloy of a Ni—Bi—Au ternary alloy and $Au_2Bi$.

2. The electronic component device according to claim 1, wherein
said first member is a main substrate provided with an electronic circuit forming section and a first sealing frame surrounding said electronic circuit forming section on a surface of the main substrate,
said second member is a cover substrate provided with a second sealing frame on a surface of the cover substrate, and
said first sealing frame comprises said first Ni film and said second sealing frame comprises said second Ni film.

3. The electronic component device according to claim 2, further comprising:
a first connecting electrode on said surface of said main substrate at a location surrounded by said first sealing frame; and a second connecting electrode on said surface of said cover substrate at a location surrounded by said second sealing frame; and an electrically connecting section electrically connecting said first connecting electrode to said second connecting electrode, said electrically connecting section having a constitution similar to that of said bonding section.

4. The electronic component device according to claim 2, wherein a width of the first sealing frame is different than a width of the second sealing frame.

5. The electronic component device according to claim 2, further comprising a metal film between at least one of (1) the first sealing frame and the main substrate and (2) the second sealing frame and the cover substrate.

6. The electronic component device according to claim 1, wherein a thickness of the first and second Ni films is set such that a total volume of Ni supplied from the first and second Ni films is 16.5% or more of a volume of a Bi layer used to form the bonding section.

7. The electronic component device according to claim 6, wherein at least one of the first and second Ni films further includes an Au layer predominantly composed of Au, and wherein a thickness of the Au layer is set such that a total volume of Au supplied from the Au layer is 11.1% or more and 27% or less of the volume of the Bi layer used to form the bonding section.

8. The electronic component device according to claim 1, wherein at least one of the first and second Ni films further includes an Au layer predominantly composed of Au, and wherein a thickness of the Au layer is set such that a total volume of Au supplied from the Au layer is 27% or more of a volume of a Bi layer used to form the bonding section.

9. The electronic component device according to claim 1, wherein an average composition ratio of the Ni—Bi—Au ternary alloy is approximately Ni:Bi:Au=11:73:16% by weight.

* * * * *